(12) United States Patent
Feiring et al.

(10) Patent No.: US 7,166,416 B2
(45) Date of Patent: *Jan. 23, 2007

(54) PROTECTING GROUPS IN POLYMERS, PHOTORESISTS AND PROCESSES FOR MICROLITHOGRAPHY

(75) Inventors: Andrew E. Feiring, Wilmington, DE (US); Viacheslav Alexandrovich Petrov, Hockessin, DE (US); Frank L. Schadt, III, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/113,695

(22) Filed: Apr. 25, 2005

(65) Prior Publication Data

US 2005/0191579 A1    Sep. 1, 2005

Related U.S. Application Data

(63) Continuation of application No. 10/398,797, filed as application No. PCT/US01/44447 on Nov. 26, 2001, now Pat. No. 6,899,995.

(60) Provisional application No. 60/253,907, filed on Nov. 29, 2000.

(51) Int. Cl.
  G03F 7/039    (2006.01)
  G03F 7/30    (2006.01)
(52) U.S. Cl. ............... 430/272.1; 430/280.1; 430/326; 430/270.1
(58) Field of Classification Search ............ None
  See application file for complete search history.

(56) References Cited

U.S. PATENT DOCUMENTS 6,303,266 B1 * 10/2001 Okino et al. ............ 430/270.1
6,699,635 B1 * 3/2004 Kodama et al. ......... 430/270.1
6,899,995 B1 * 5/2005 Feiring et al. .......... 430/272.1
2003/0082483 A1   5/2003 Hohle et al.

FOREIGN PATENT DOCUMENTS

| EP | 1020787 A1 | 7/2000 |
| JP | 1999/012328 | 1/1999 |
| WO | WO 0025178 | 5/2000 |
| WO | WO 0110916 A1 | 2/2001 |
| WO | WO 0204532 A1 | 1/2002 |

OTHER PUBLICATIONS

XP002208775 Chemical Abstract, vol. 133(7), Aug. 14, 2000, Columbus, Ohio, Abstract No. 98786, K. Kodama et al, Positive-Working Photosensitive Composition Containing Lactone Methacrylate Copolymer.
Introduction to Microlithography, Second Edition by L.F. Thompson, C.G. Willson and M. J. Bowden, American Chemical Society, Washington, DC 1994 (Book not supplied).

* cited by examiner

*Primary Examiner*—Cynthia Hamilton

(57) ABSTRACT

The invention relates to a photoresist composition having a protecting group and a protected material incorporated in a cyclic chemical structure. In this invention a protected material has a cyclic ether group or cyclic ester group as a protecting group. A specific example of a cyclic ether group is an alkylene oxide, such as an oxetane group, substituted with one or more fluorinated alkyl groups. A specific example of a cyclic ester is a lactone which may be substituted with methyl groups. The photoresist composition further includes a photoactive component. The photoresist composition of this invention has a high transparency to ultraviolet radiation, particularly at short wavelengths such as 193 nm and 157 nm.

24 Claims, No Drawings

PROTECTING GROUPS IN POLYMERS, PHOTORESISTS AND PROCESSES FOR MICROLITHOGRAPHY

BACKGROUND OF THE INVENTION

1. Field of the Invention

The present invention pertains to photoimaging and, in particular, the use of photoresists (positive-working and/or negative-working) for imaging in the production of semiconductor devices. The present invention also pertains to novel fluorine-containing polymer compositions having high UV transparency (particularly at short wavelengths, e.g., 157 nm) which are useful as base resins in photoresist and potentially in many other applications.

2. Description of Related Art

Polymer products are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

Although the polymer product itself may be photoactive, generally a photosensitive composition contains one or more photoactive components in addition to the polymer product. Upon exposure to electromagnetic radiation (e.g., UV light), the photoactive component acts to change the rheological state, solubility, surface characteristics, refractive index, color, electromagnetic characteristics or other such physical or chemical characteristics of the photosensitive composition as described in the Thompson et al. publication supra.

For imaging very fine features at the submicron level in semiconductor devices, electromagnetic radiation in the far or extreme ultraviolet. (UV) is needed. Positive working resists generally are utilized for semiconductor manufacture. Lithography in the UV at 365 nm (I-line) using novolak polymers and diazonaphthoquinones as dissolution inhibitors is a currently established technology having a resolution limit of about 0.35–0.30 micron. Lithography in the far UV at 248 nm using p-hydroxystyrene polymers is known and has a resolution limit of 0.35–0.18 nm. There is strong impetus for future photolithography at even shorter wavelengths, due to a decreasing lower resolution limit with decreasing wavelength (i.e., a resolution limit of 0.18–0.12 micron for 193 nm imaging and a resolution limit of about 0.07 micron for 157 nm imaging). Photolithography using 193 nm exposure wavelength (obtained from an argon fluorine (ArF) excimer laser) is a leading candidate for future microelectronics fabrication using 0.18 and 0.13 μm design rules. Photolithography using 157 nm exposure wavelength (obtained from a fluorine excimer laser) is a leading candidate for future microlithography further out on the time horizon (beyond 193 nm) provided suitable materials can be found having sufficient transparency and other required properties at this very short wavelength. The opacity of traditional near UV and far UV organic photoresists at 193 nm or shorter wavelengths precludes their use in single-layer schemes at these short wavelengths.

Development of photoresist compositions having one or more protected acidic groups may be by catalysis of acids or bases generated photolytically from photoactive compounds (PACs) which yield hydrophilic acid groups. A given protected acid group is one that is normally chosen on the basis of its being acid labile, such that when photoacid is produced upon imagewise exposure, the acid will catalyze deprotection and production of hydrophilic acid groups for development under aqueous conditions.

Examples of components having protected acidic groups that yield an acidic group as the hydrophilic group upon exposure to photogenerated acid include, but are not limited to, A) esters capable of forming, or rearranging to, a tertiary cation, B) esters of lactone, C) acetal esters, D) β-cyclic ketone esters, E) α-cyclic ether esters, F) MEEMA (methoxy ethoxy ethyl methacrylate) and other esters which are easily hydrolyzable because of anchimeric assistance, G) carbonates formed from a fluorinated alcohol and a tertiary aliphatic alcohol. Some specific examples in category A) are t-butyl ester, 2-methyl-2-adamantyl ester, and isobornyl ester. Some specific examples in category B) are γ-butyrolactone-3-yl, γ-butyrolactone-2-yl, mavalonic lactone, 3-methyl-γ-butyrolactone-3-yl, 3-tetrahydrofuranyl, and 3-oxocyclohexyl. Some specific examples in category C) are 2-tetrahydropyranyl, 2-tetrahydrofuranyl, and 2,3-propylenecarbonate-1-yl. Additional examples in category C) include various esters from addition of vinyl ethers, such as, for example, ethoxy ethyl vinyl ether, methoxy ethoxy ethyl vinyl ether, and acetoxy ethoxy ethyl vinyl ether.

It has been found that these protecting groups may generate volatile products during exposure because of deprotection before any post-exposure heating step, especially as exposure wavelengths are decreased for new imaging systems. Production of volatile products on exposure is disadvantageous since such volatiles can coat exposure device lenses and negatively affect their imaging properties, requiring expensive cleaning processes. Loss of volatile material can also cause shrinkage in the imaged areas of the photoresists and negatively affect image quality.

JP 11012326 publication discloses the following reaction:

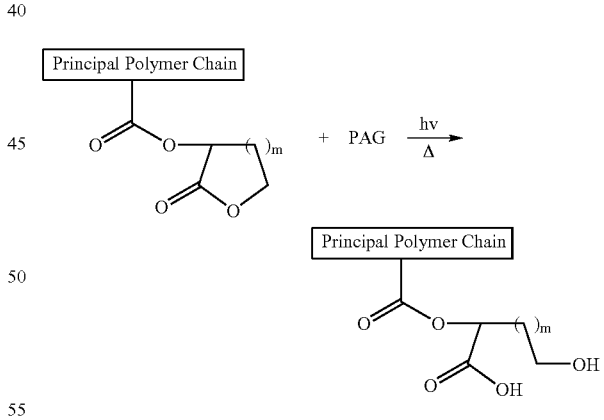

This suggests that the lactone ring can be opened by photoacid catalysis, but also clearly indicates that this reaction requires the presence of moisture, and that the reaction is terminated in the absence of moisture. In this process water as an external agent is used for reaction. Processes not requiring an external agent, in addition to a photoacid generator, would be advantageous.

There is a need for protecting groups for polymer resist compositions, for use particularly at 193 nm or 157 nm, that provide deprotection without the generation of volatiles.

SUMMARY OF THE INVENTION

Volatile components are those materials that will evaporate out of the polymeric ingredients of the photoresist composition causing coating of exposure lenses, and a loss of polymer mass that may lead to poor image quality. The invention is related to incorporating a protecting group and a polar group (that is to be protected) in a cyclic structure so that volatile components are not released during deprotection of the polar group by photogenerated catalyst leading to solubility in developer. This approach can be used for both the polymeric binder of the photoresist composition and/or the dissolution inhibitor of the photoresist composition.

In a first aspect, the invention provides a photoresist composition comprising:

(a) a protected material comprising:

A. one or more cyclic ether groups having structure I or II:

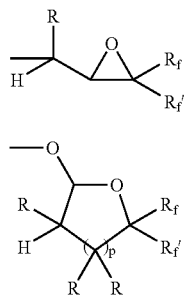

wherein $R_f$ and $R_f'$ independently represent fluoroalkyl groups of from one to about ten carbon atoms or taken together are $(CF_2)_a$ wherein a is an integer ranging from 2 to about 10, R independently represents a hydrogen atom or a straight chain or branched chain alkyl group of 1 to about 10 carbon atoms, and p is an integer of from 0 to about 8; wherein the protected material is substantially free of an acid group with a pKa of <11; or (B) one or more cyclic esters having structure III:

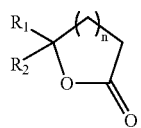

wherein $R_1$ and $R_2$ independently represent an unsubstituted straight chain or branched chain alkyl group having 1 to 10 carbon atoms; aromatic, aralkyl, or alkaryl group having 6 to 14 carbon atoms; or substituted groups thereof containing at least one O, S, N, P or halogen; and n is an integer ranging from 1 to about 4; and (b) a photoactive component.

In a second aspect, the invention relates to a process for preparing a photoresist image on a substrate comprising, in order:

1. providing a photoresist layer on a substrate, wherein the photoresist layer is prepared from a photoresist composition comprising:

(a) a protected material comprising a group which is:

A. one or more cyclic ether groups having structure I or II:

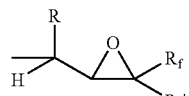

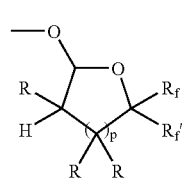

wherein $R_f$ and $R_f'$ independently represent fluoroalkyl groups of from one to about ten carbon atoms or taken together are $(CF_2)_a$ wherein a is an integer ranging from 2 to about 10, R independently represents a hydrogen atom or a straight chain or branched chain alkyl group of 1 to about 10 carbon atoms, and p is an integer of from 0 to about 8; wherein the protected material is substantially free of an acid group with a pKa of <11; or B. one or more cyclic esters having structure III:

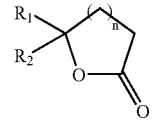

wherein $R_1$ and $R_2$ independently represent an unsubstituted straight chain or branched chain alkyl group having 1 to 10 carbon atoms; aromatic, aralkyl, or alkaryl group having 6 to 14 carbon atoms; or substituted groups thereof containing at least one O, S, N, P or halogen; n is an integer ranging from 1 to about 4; and (b) a photoactive component;

2. imagewise exposing the photoresist layer to form imaged and non-imaged areas; and 3. developing the exposed photoresist layer having imaged and non-imaged areas to form the relief image on the substrate.

An example of a cyclic ether group represented by (A) is an oxetane group having the following structure:

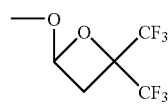

An example of a cyclic ester group represented by (B) is provided by a substituted lactone having the following structure:

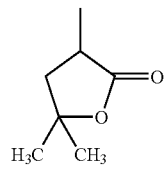

A polymer containing this group can be obtained by incorporating the dimethyl tulipalin monomer (γ,γ-dimethyl-α-methylene-γ-butyrolactone). The deprotection of these two classes of protecting groups is catalyzed by photogenerated acid without the requirement that moisture be present and without the generation of volatiles.

DETAILED DESCRIPTION OF THE PREFERRED EMBODIMENT(S)

Protecting Groups:

The protected material comprises a protecting group selected from the group consisting of one or more cyclic ether groups or cyclic ester groups having the structures A or B, as shown above.

Materials containing a cyclic ether group represented by structure I may be prepared, for example, by hypochlorite oxidation of compounds containing the —CH═$CR_fR_f'$ fragment as described in WO 2000/066575A2. Materials containing the cyclic ether protecting group represented by structure 11 wherein p is 0 may be prepared, for example, by the method disclosed in U.S. Pat. No. 3,164,610 (1964) or in Izv. Akad. Nauk. Ser. Khim. 1967, pp. 918–921 using the reaction of corresponding vinyl ether with hexafluoroacetone. Materials containing the cyclic ether-group wherein p is 0 to about 8 may be prepared by cyclization of α-haloethers of structure —O—CHCl—CHR—$(CRR)_p$—$C(R_fR_f')$OH in the presence of base.

Cyclic ether groups of formula I or II may be converted thermally or by action of catalytic amount of acid into a fluoroalcohol containing material of formulas I' and II', respectively, as a result of ring-opening processes presented below:

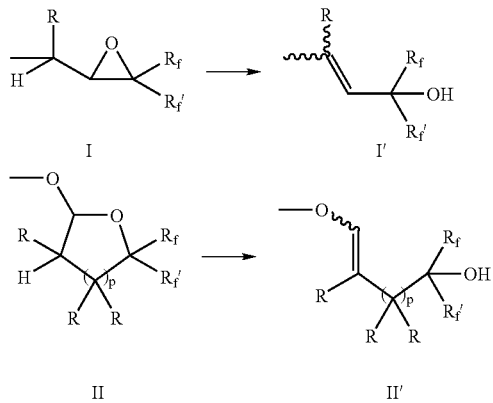

The cyclic esters which can be converted into a carboxylic acid may be substituted lactones which open in the presence of strong acid. An example is the polymerizable monomer, dimethyl tulipalin (γ,γ-dimethyl-α-methylene-γ-butyrolactone. Such functional groups can also be attached to non-polymeric structures.

The point of attachment of the protected material to the protecting group in structure I or II will be to a carbon atom which is a substituent of the ether ring. At least one point of attachment of the protected material to the protecting group in structure III will be through a saturated ring carbon of the structure or $R_1$ or $R_2$.

Protected Material:

The protected material may be a binder or a dissolution inhibitor.

The binder may be a polymeric binder. Examples include all polymers useful as photoresists such as those of the type disclosed in WO 00/17712 published Mar. 20, 2000, WO 00/25178 published May 4, 2000, and PCT/US00/11539 filed Apr. 28, 2000, with the proviso that the photoresist composition in its unexposed state does not have acid groups with a pKa of <11, typically <12, and more typically <14 when the protecting group is a cyclic ether represented by Structures I and II.

The polymer binder may be a fluorine-containing polymer. The fluorine-containing polymer may further comprise a repeat unit derived from at least one ethylenically unsaturated compound containing a functional group having the structure:

—$C(R_f)(R_f')OR_3$ wherein $R_f$ and $R_f'$ are the same or different fluoroalkyl groups of from 1 to about 10 carbon atoms or taken together are $(CF_2)_n$ wherein n is 2 to about 10, and $R_3$ is a hydrogen atom or an acid labile protecting group, when the protected material is a cyclic ether group $R_3$ is an acid labile protecting group.

The fluoroalkyl groups designated as $R_f$ and $R_f'$, can be partially fluorinated alkyl groups or fully fluorinated alkyl groups (i.e., perfluoroalkyl groups).

Broadly, $R_f$ and $R_f'$ are each independently represented by fluoroalkyl groups of from 1 to about 10 carbon atoms or taken together are $(CF_2)_n$ wherein n is an integer ranging from 2 to about 10. The terms "taken together" mean that $R_f$ and $R_f'$ are not separate, discrete fluorinated alkyl groups, but that together they form a ring structure of 3 to about 11 carbon atoms such as is illustrated below in case of 5-membered rings:

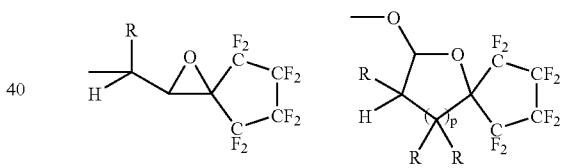

When $R_f$ and $R_f'$ are partially fluorinated alkyl groups there must be a sufficient degree of fluorination present to impart acidity to the hydroxyl (—OH) of the ring opened form, such that the hydroxyl proton is substantially removed in basic media, such as in aqueous sodium hydroxide solution or tetraalkylammonium hydroxide solution. Typically, there will be sufficient fluorine substitution present in the fluorinated alkyl groups of the fluoroalcohol functional group in the ring opened form such that the hydroxyl group will have a pKa value as follows: 5<pKa<11.

Preferably, $R_f$ and $R_f'$ are independently perfluoroalkyl group of 1 to about 5 carbon atoms, and, most preferably, $R_f$ and $R_f'$ are both trifluoromethyl ($CF_3$). A protected material containing the protecting group of structure II when p is 0 or 1 and R is a hydrogen atom are preferred.

When the protected material is a polymeric binder, it may also be prepared from ethylenically unsaturated monomers by free radical polymerization or metal-catalyzed vinyl addition polymerization processes known in the art to afford a polymer having a repeat unit that is derived from the ethylenically unsaturated monomer. Specifically, an ethylenically unsaturated compound having structure:

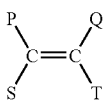

that undergoes free radical polymerization will afford a polymer having a repeat unit:

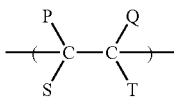

where P, Q, S, and T independently can be the same or different and illustratively could be fluorine, hydrogen, chlorine, and trifluoromethyl.

If only one ethylenically unsaturated compound undergoes polymerization, the resulting polymer is a homopolymer. If two or more distinct ethylenically unsaturated compounds undergo polymerization, the resulting polymer is a copolymer.

Some representative examples of ethylenically unsaturated compounds and their corresponding repeat units are described below:

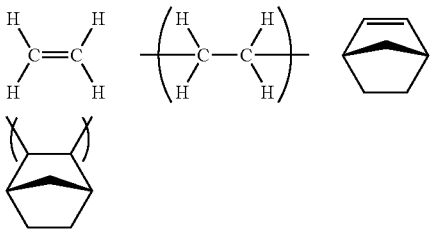

For metal catalyzed vinyl addition polymerization a useful catalyst is a nickel containing complex. Neutral Ni catalysts are described in WO 9830609. Other references regarding the salicylaldimine-based neutral nickel catalysts include WO Patent Application 9842664. Wang, C.; Friedrich, S.; Younkin, T. R.; Li, R. T.; Grubbs, R. H.; Bansleben, D. A.; Day, M. W. *Organometallics* 1998, 17 (15), 314 and Younkin, T.; Connor, E. G.; Henderson, J. I.; Friedrich, S. K.; Grubbs, R. H.; Bansleben, D. A. *Science* 2000, 287, 460462. Additional catalysts are disclosed in Ittel, S. D.; Johnson, L. K.; Brookhart, M. Chem. Rev. 2000, 100, 1169–1203 and Boffa, L. S.; Novak, B. M. *Chem. Rev.* 2000, 100, 1479–1493. Moody, L. S.; MacKenzie, P. B.; Killian, C. M.; Lavoie, G. G.; Ponasik, J. A.; Barrett, A. G. M.; Smith, T. W.; Pearson, J. C. WO 0050470 discloses improvements or variations of largely existing ligands and some new ligands on late metal catalysts, e.g., ligands derived from pyrrole amines instead of anilines and also ligands based on anilines with 2,6-ortho substituents where these ortho substituents are both aryl groups or any aromatic group. Specific examples would be alpha-diimine-based nickel catalysts and salicylaldimine-based nickel catalysts derived from the pyrrole amines and ortho-aromatic-substituted anilines. Some of these derivatives show improved lifetimes/activities/productivities/hydrogen response/potential functional group tolerance, etc. Another useful catalyst is a functional group tolerant, late metal catalyst usually based on Ni(II) or Pd(II). Useful catalysts are disclosed in WO 98/56837 and U.S. Pat. No. 5,677,405.

Any suitable polymerization conditions may be employed in the process of making the polymer. Typically, when metal catalyzed vinyl addition polymerization is used the temperatures are held below about 80° C., typically between 20° C. and 80° C. Suitable known solvents may be used such as trichlorobenzene or p-xylene.

It is desirable that binder polymers used in photoresist compositions be highly transparent at the wavelength of light used for creating the photoimage. Preferably, the binder has an absorption coefficient of less than 4.0 $\mu m^{-1}$, more preferably of less than 3.5 $\mu m^{-1}$, and, still more preferably, of less than 2.5 $\mu m^{-1}$ at the wavelength. As shown in an example, binder polymers having the fluorinated cyclic ether grouping can have a high degree of transparency at 157 nm making these compositions especially useful at this wavelngth.

Some illustrative, but nonlimiting, examples of comonomers containing a fluorinated cyclic ether group within the scope of this invention are presented below:

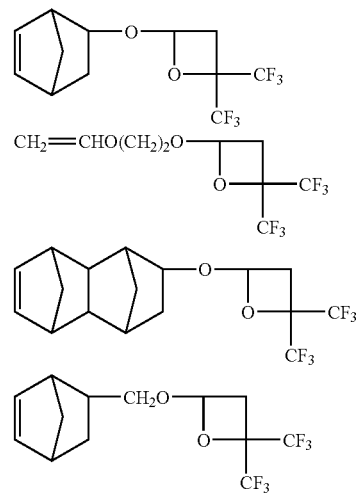

The fluorine-containing binder polymer of this invention may, optionally comprise additional protected fluoroalcohol functional groups. Some illustrative, but not limiting, examples of representative comonomers containing protected fluoroalcohol groups are described below:

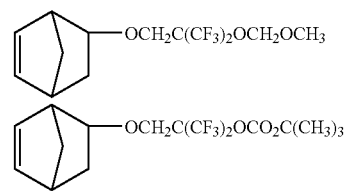

The fluorine-containing polymer may be photactive, i.e. the photoactive component may be chemically bonded to the fluorine-containing polymer. This may be accomplished by chemically bonding the photoactive component to a monomer which then undergoes copolymerization to the monomers, thus eliminating the need for a separate photoactive component.

A fluorine-containing polymer of this invention may comprise a repeat unit derived from at least one ethylenically unsaturated compound characterized in that at least one ethylenically unsaturated compound is polycyclic and at least one ethylenically unsaturated compound contains at least one fluorine atom covalently attached to an ethylenically unsaturated carbon atom.

One or more additional monomers may be used in the preparation of the fluorine-containing polymers. In general, it is contemplated that an acrylate monomer may be suitable as the additional monomer in preparing the polymers. Typical additional monomers include acrylates, olefins containing electron-withdrawing groups (other than fluorine) directly attached to the double bond. These terpolymers may be made by free-radical polymerization, for example, acrylonitrile, vinyl chloride, vinylidene chloride. Vinyl acetate is also useful as an additional monomer.

Alternately, the fluorine-containing polymer may contain a spacer group.

The spacer group is a hydrocarbon compound containing vinylic unsaturation and optionally, containing at least one heteroatom, such as an oxygen atom or a nitrogen atom. The hydrocarbon compound contemplated as the spacer group contains, typically, 2 to 10, more typically 2 to 6 carbon atoms. The hydrocarbon may be straight chain or branched chain. Specific examples of suitable spacer groups are selected from the group consisting of ethylene, alpha-olefins, 1,1'-disubstituted olefins, vinyl alcohols, vinyl ethers, and 1,3-dienes. Typically, when the spacer group is and alpha olefin, it is selected from the group consisting of ethylene, propylene, 1-butene, 1-pentene, 1-hexene and 1-octene. Typically, when the spacer group is a vinyl ether it is selected from the group consisting of methyl vinyl ether and ethyl vinyl ether. Typically vinyl alcohols would be obtained by post-polymerization hydrolysis of a functional group already incorporated into the polymer backbone, e.g. the acetate group of vinyl acetate. Typically when the spacer group is a 1,3-diene it is butadiene. Typically when the spacer group is a 1,1'-disubstituted olefin it is isobutylene or isopentene.

The ratio of spacer group containing monomer and other monomers can be important. Typical ranges for each are about 30% to about 70%. Alternately, spacer groups selected from the group consisting of ethylene, alpha-olefins, 1,1'-disubstituted olefins, vinyl alcohols, vinyl ethers, and 1,3-dienes may be present in the polymer. Other polymer types such as methacrylates and acrylates may also be used.

The quantity of polymeric binder in the photoresist composition may be in the amount of about 50 to about 99.5 weight % based on the total weight of the photoresist composition (solids).

Photoactive Component (PAC)

The photoresist composition contains a combination of binder and photoactive component.

If the polymer of the binder itself is photoactive, a separate photoactive component is not required. It is contemplated that the photoactive component may be chemically bonded to the polymer of the binder. A system in which the polymeric binder itself is photochemically active is described in EP 473547. Therein a photoresist comprises an olefinically unsaturated sulfonium or iodonium salt (the photochemically active component) copolymerized with an olefinically unsaturated comonomer containing an acid sensitive group yielding a radiation sensitive copolymer that would be an effective photoactive polymeric binder.

When the compositions of this invention contain a separate photoactive component (PAC) the binder itself is usually not photactive.

The photoactive component (PAC) usually is a compound that produces either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure A), 2) iodonium salts (structure B), and 3) hydroxamic acid esters, such as structure C.

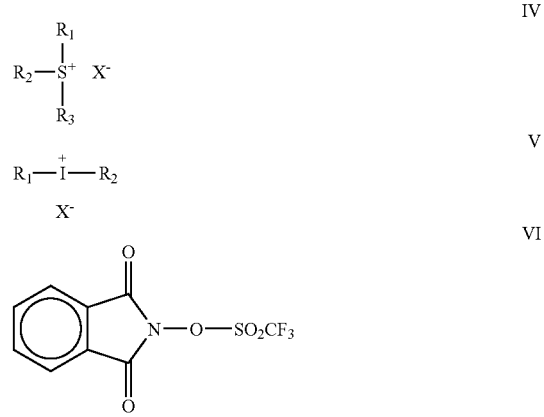

In structures IV–V, $R_1$ 14 $R_3$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to, hydroxyl (—OH) and $C_1$–$C_{20}$ alkyloxy (e.g., $C_{10}H_{21}O$). The anion X— in structures IV–V can be, but is not limited to, $SbF_6$-(hexafluoroantimonate), $CF_3SO_3$-(trifluoromethylsulfonate=triflate), and $C_4F_9SO_3$-(perfluorobutylsulfonate).

Dissolution Inhibitor

When the protected material of this invention is a dissolution inhibitor, it includes compounds which have been found to have a sufficiently low absorption coefficient for use in microlithography at the imaging wavelengths. Specifically, the compounds of this invention may have an absorption coefficient of less than about 4.0 $\mu m^{-1}$ at a wavelength of 157 nm, typically, less than about 3.5 $\mu m^{-1}$ at a wavelength of 157 nm, and still more typically less than about 3.0 $\mu m^{-1}$ at a wavelength of 157 nm and still more typically less than about 2.5 $\mu m^{-1}$ at a wavelength of 157 nm. Dissolution inhibitors may satisfy multiple functional needs including dissolution inhibition, plasma etch resistance, plasticising and adhesion behavior of resist compositions.

The protected material may be a dissolution inhibitor. The dissolution inhibitor usually comprises a paraffinic or cycloparaffinic or oligomeric compound. The dissolution inhibitor may have a structure comprising the same monomer components as the binder but usually it has a lower molecular weight than the polymer of the binder. For example, the dissolution inhibitor may contain a at least one functional group having the structure:

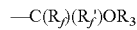

as described above. The dissolution inhibitor may also comprise a cyclic ester that can be opened by photogenerated acid in the absence of moisture.

However, when the protected material is a dissolution inhibitor, the polymeric binder may be any polymer which has the transparency properties suitable for use in microlithography. It is contemplated that binders suitable for the present invention may include those polymers which are typically incorporated into chemically amplified 248 (deep UV) and 193 nm photoresists for imaging at longer wavelengths. A typical 248 nm resist binder is based on polymers of para-hydroxystyrene. Other examples of suitable 248 nm resist binders can be found in the reference *Introduction to Microlithography*, Second Edition by L. F. Thompson, C. G. Willson, and M. J. Bowden, American Chemical Society, Washington, D.C., 1994, chapter 3. Binders useful for 193 nm photoresists include cycloolefin-maleic anhydride alternating copolymers [such as those disclosed in F. M. Houlihan et al., *Macromolecules*, 30, pages 6517–6534 (1997); T. Wallow et al., Proc. SPIE, 2724, 355; and F. M. Houlihan et al., *Journal of Photopolymer Science and Technology*, 10, 511(1997)], polymers of functionalized norbornene-type monomers prepared by metal-catalyzed vinyl addition polymerization or ring-opening metathesis polymerization [such as those disclosed in U. Okoroanyanwu et al. *J. Mol. Cat. A: Chemical* 133, 93 (1998), and PCT WO 97/33198], and acrylate copolymers [those described in U.S. Pat. No. 5,372, 912]. Photoresist binders that are suitable for use with this invention also include those which are transparent at wavelengths below 248 and 193 nm such as those polymers containing fluoroalcohol functional groups [such as those disclosed in K. J. Pryzbilla et al. *Proc. SPIE* 1672, 9 (1992), and H. Ito et al. *Polymn. Mater. Sci. Eng.* 77, 449 (1997)].

Typical examples of polymers which are also useful as a dissolution inhibitor are those which have been developed for use in chemically amplified photoresists which are imaged at an irradiation wavelength of 157 nm. Specific examples of such polymers are fluoropolymers and fluoropolymers containing fluoroalcohol functional groups. Suitable examples have been disclosed in WO 00/17712, WO 00/25178 and PCT/US00/11539 filed Apr. 28, 2000, with the proviso that the photoresist composition in its unexposed state does not have acid groups with a pKa of <11, typically <12, and more typically <14 when the protecting group is a cyclic ether represented by Structures I and II.

Dissolution inhibitors having the protecting groups of this invention may comprise a paraffinic or cycloparaffinic compound containing at least one protecting group, typically at least two, more typically 2 to about 10 and most typically 2 to 3 cyclic ether protecting groups having structure I, II or III as described above.

Typically, when the compound contains at least 2 of the protecting groups there is improved solubility of the dissolution inhibitor in the developed form and less solubility in the undeveloped form.

Typically, $R_f$ and $R_f'$ are independently a perfluoroalkyl group of 1 to about 5 carbon atoms, more typically a perfluoroalkyl group of 1 to about 3 carbon atoms, and most typically $R_f$ and $R_f'$ are both trifluoromethyl ($CF_3$).

The fluoroalkyl groups, designated as $R_f$ and $R_f'$, can be partially fluorinated alkyl groups or fully fluorinated alkyl groups (i.e., perfluoroalkyl groups), as described above.

In preferred cases according to the invention, there will be sufficient fluorine substitution present in the fluorinated alkyl groups of the fluoroalcohol functional group such that the hydroxyl group will have a pKa value as follows: $5 < pKa < 11$.

In one aspect, the dissolution inhibitor is an oligomer comprising a repeat unit derived from at least one ethylenically unsaturated compound containing a protected fluoroalcohol functional group having one or more A cyclic ether group or B cyclic ester group, the structures of which are described above.

An oligomer is a low molecular weight polymer (e.g. dimer, trimer, tetramer), in the present case, with a number average molecular weight of less than or equal to 3000. As is well known to those skilled in the art, certain ethylenically unsaturated compounds (monomers) undergo free radical polymerization or metal-catalyzed addition polymerization to form polymers having repeat unit(s) derived from the ethylenically unsaturated compounds. By suitable adjustments in polymerization conditions and especially by employing a chain transfer agent or chain terminating agent in the synthesis, the molecular weight of the product may be controlled to the desired range. Chain transfer agents which are useful for controlling molecular weight in free radical polymerizations are well known in the art and include primary and seconday alcohols, such as methanol, ethanol and 2-propanol, chlorocarbons, such as carbon tetrachloride, and thiols, such as dodecyl mercaptan. Transition metal-catalyzed addition polymerization of monomers containing cyclic fluorinated ether groups may be employed. Molecular weight can be reduced so as to form oligomers by the addition of suitable chain-transfer agents; for example, hydrogen, silanes, or olefins such as ethylene, propylene, or 1-hexene. The use of olefins to control and reduce molecular weight in polymerizations of norbornene-type monomers catalyzed by nickel and palladium catalysts is known in the art; for example, see U.S. Pat. Nos. 5,741,869; 5,571,881; 5,569,730 and 5,468,819.

Some illustrative, but nonlimiting, examples of representative monomers containing a fluorinated ether functional group and within the scope of the invention are presented below:

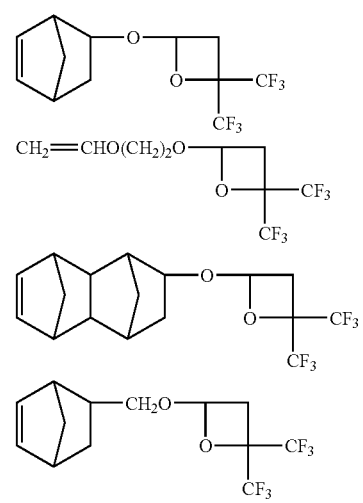

In another aspect of this invention, the dissolution inhibitor is a compound comprising the following structures:

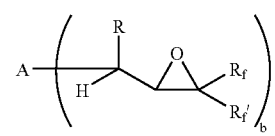

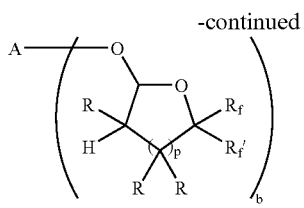

wherein A is a paraffinic or cycloparaffinic group containing 2 to 30 carbon atoms, $R_f$ and $R_f'$ are as described hereinabove b is an integer ranging from at least 1, typically at least 2, more typically 2 to about 10 and most typically 2 to 3.

The paraffinic or cycloparaffinic group is understood to be one comprising carbon and hydrogen atoms and to be substantially free of ethylenic, acetylenic or aromatic unsaturation. The paraffinic or cycloparaffinic group may contain heteroatoms selected from the group consisting of fluorine, chlorine and oxgen. Such heteroatoms may form substituent groups which do not substantially contribute to absorption at short wavelengths of light. Specific examples of such oxygen containing substituent groups are hydroxyl and ether. For example, a cycloparaffinic starting material is 4,4'-isopropylidenedicyclohexanol. Some illustrative, but non-limiting, examples of dissolution inhibitors within the scope of this embodiment are presented below:

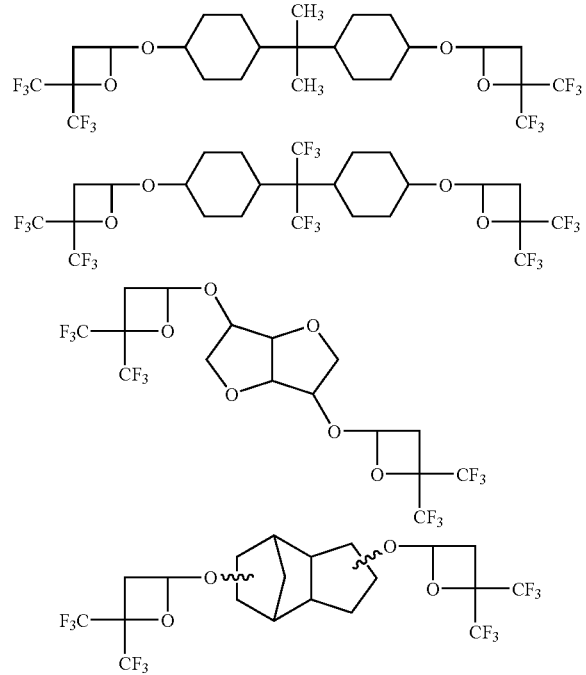

In cases wherein the dissolution inhibitor of this invention contains more than one fluorinated cyclic ether group, the $R_f$ and $R_f'$ groups may be the same or different.

The fluorinated ether group may be used alone or it can be used in combination with one or more other protected acid groups, such as protected fluoroalcohol or carboxylic acid groups.

The dissolution inhibitor may be prepared by processes know in the art, for example, the materials shown above containing the bis(trifluoromethyl)oxetane groups may be made by reaction of corresponding bisvinyl ethers with hexafluoroacetone as disclosed in U.S. Pat. No. 3,164,610 (1964) or in *Izv. Akad. Nauk. Ser. Khim.* 1967, pp. 918–921.

Some dissolution inhibiting compounds also serve as plasticizers in resist compositions.

A dissolution inhibiting amount of the dissolution inhibitor is combined with a binder and any other photoresist additives. The dissolution inhibitor may be present in the amount of about 0.5 to about 50 weight %, more typically about 1 to about 35 weight %, and most typically about 5 to about 20 weight %, based on the total weight of the photoresist composition (solids).

Other Components

The compositions of this invention can contain optional additional components. Examples of such additional components include, but are not limited to, resolution enhancers, adhesion promoters, residue reducers, coating aids, plasticizers, and $T_g$ (glass transition temperature) modifiers.

Process Steps

Imagewise Exposure

The photoresist compositions of this invention are sensitive in the ultraviolet region of the electromagnetic spectrum and especially to those wavelengths $\leq 365$ nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths, preferably it is done with ultraviolet light of 193 nm, 157 nm, or lower wavelengths, and most preferably, it is done with ultraviolet light of 157 nm or lower wavelengths. Imagewise exposure can either be done digitally with a laser or equivalent device or non-digitally with use of a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. Since, as discussed supra, use of UV light of lower wavelength for imagewise exposure corresponds to higher resolution (lower resolution limit), the use of a lower wavelength (e.g., 193 nm or 157 m or lower) is generally preferred over use of a higher wavelength (e.g., 248 nm or higher).

Development

The polymers in the resist compositions of this invention must contain sufficient functionality for development following imagewise exposure to UV light. Typically, the functionality is acid or protected acid such that aqueous development is possible using a basic developer such as sodium hydroxide solution, potassium hydroxide solution, or ammonium hydroxide solution. The protecting groups of the present invention are advantageous since they do not require moisture to deprotect the developable group, in addition to not yielding a volatile deprotection product due to the cyclic nature of the protecting group.

When an aqueous processable photoresist is coated or otherwise applied to a substrate and imagewise exposed to UV light, development of the photoresist composition may require that the binder material should contain sufficient protected acid groups that are at least partially deprotected upon exposure to render the photoresist (or other photoimageable coating composition) processable in aqueous alkaline developer. In case of a positive-working photoresist layer, the photoresist-layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmospheres below the critical pressure of the fluid. Carbon dioxide may be used for the critical fluid in the present invention.

Various organic solvents can also be used as developer in this invention. These include, but are not limited to, halogenated solvents and non-halogenated solvents. Halogenated solvents are preferred and fluorinated solvents are more preferred.

Substrate

The substrate employed in this invention can illustratively be silicon, silicon oxide, silicon nitride, or various other materials used in semiconductive manufacture.

EXAMPLES

Example 1

A compound having the following structure was prepared using the following procedure:

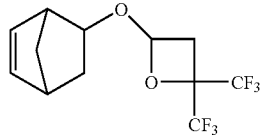

25 g of vinyl ether prepared from exo-5-norbornen-2-ol were dissolved in 100 mL of ether, 0.5 g of potassium carbonate was added to a solution and 32 g of hexafluoroacetone (5% excess) fed into reaction vessel as a gas at 10–15° C. The reaction mixture was brought to 25° C. and was agitated at this temperature for 1 h. The solvent was removed under vacuum at 30° C. and the crude product was distilled under vacuum to give 34.8 g (63%) of product >95% purity, b.p. 50–52° C./0.38 mm Hg.

$^1$H NMR (CDCl$_3$): 1.3–1.8 (4H), 2.7–3.1 (4H), 3.8 (2H), 5.6 (1H), 6.1 (1H) ppm, $^{19}$F NMR (CDCl$_3$): −79.13 (3F, m), −79.28 (3F, m)PPM.

Example 2

Oxetane A monomer having the following structure was prepared using the following procedure:

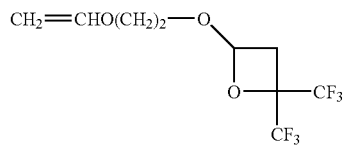

22.8 g (0.2 mol) of CH$_2$=CHO(CH$_2$)$_2$OCH=CH$_2$ were dissolved in 100 mL of dry ether, and 33 g (0.2 mol) of hexafluoroacetone were introduced into reactor as a gas at −20° C. The reaction mixture was maintained at −15° C. for 30 min, warmed up to 25° C., solvent was removed under vacuum and residue (55 g) was distilled under reduced pressure in the presence of 0.1 g of K$_2$CO$_3$ to give 26 g (46.6%) of fraction b.p. 43–48° C./0.25 mm Hg (major fraction 45–46° C.), which was found to be the title compound of >98% purity. The residue 25 g based on NMR data was mostly the product of condensation of one mole of divinyl ether with two moles of hexafluoroacetone.

$^1$H NMR (acetone-d$_6$): 2.60 (1H), 2.8 (1H, dd), 3.15 (1H, dd), 3.64.2 (5H), 5.65 (1H,t), 6.35 (1H, dd) PPM; $^{19}$F NMR (acetone-d$_6$): −79.72 (3F, m), −79.83 (3F, m) PPM.

Example 3

A Bis(trifluorooxetane)-containing polymer was synthesized using the following procedure:

A 200 mL stainless steel autoclave was charged with 15.4 g (0.08 mol) of adamantanemethylvinyl ether (AdVether), 22.4 g (0.08 mol) of the oxetane monomer of Example 2 (OXVE), 50 mL of tert-butanol, 25 mL of isopropanol, 0.5 g of potassium carbonate and 0.4 g of Vazo® 52. The vessel was closed, cooled, evacuated and purged with nitrogen several times. It was then charged with 24.0 g (0.24 mol) of tetrafluoroethylene (TFE). The autoclave was agitated with the vessel contents at 50° C. for about 18 hr resulting in a pressure change from 294 psi to 134 psi. The vessel was cooled to room temperature and vented to one atmosphere. The vessel contents were removed using acetone to rinse giving a clear slightly yellow solution. This solution was added slowly to excess ice water resulting in precipitation of a white polymer which was dried overnight in a vacuum oven. The yield was 49.8 g (81%). GPC analysis: Mn=35, 500; Mw=73300; Mw/Mn=2.06. DSC analysis: A Tg of 35° C. was observed on second heat. $^1$H NMR (δ, THF-d8) 1.48–2.05 (m, 15H from adamantane rings), 2.37–2.80 (m, CH$_2$ from polymer backbone), 2.91 (m, 1 oxetane ring H), 3.15 (m, 1 oxetane ring H), 3.20–3.40 (m, CH$_2$O attached to adamantane ring), 3.87: (m, OCH$_2$CH$_2$O attached tooxetane ring), 4.22 and 4.40 (m, CH on polymer backbone), 5.68 (m, acetal hydrogen). By integration, the ratio of OXVE to AdVether in the polymer is 57:43. $^{19}$F NMR (δ, THF-d8) −78.9 (CF$_3$), −107 to −125 (CF$_2$). From the fluorine NMR, the ratio of OXVE to TFE in the polymer is 33 to 67. Combining these ratios suggests an overall composition of 53% TFE, 20% AdVether and 26% OXVE. Anal. Found: C, 46.34; H, 4.43; F, 37.96.

Example 4

A Bis(trifluoromethyl)oxetane-containing polymer was prepared using the following procedure:

A 200 mL stainless steel autoclave was charged with 16.0 g (0.17 mol) of norbornene, 21.1 g (0.07 mol) of the oxetane-containing monomer of Example 1 (NB-OX), 75 mL of 1,1,2-trichlorotrifluoroethane, 0.5 g of potassium carbonate and 1.0 g of Perkadox® 16. The vessel was closed, cooled, evacuated and purged with nitrogen several times. It was then charged with 30 g (0.30 mol) of tetrafluoroethylene (TFE). The autoclave was agitated with the vessel contents at 50° C. for about 18 hr resulting in a pressure change from 228 psi to 201 psi. The vessel was cooled to room temperature and vented to one atmosphere. The vessel contents were removed using 1,1,2-trichlorotrifluoroethane to rinse giving a clear solution. This solution was added slowly to excess methanol resulting in precipitation of a white polymer which was dried over night in a vacuum oven. Yield was 17.1 g (25%). GPC analysis: Mn=5200; Mw=8200; Mw/Mn=1.57. DSC analysis: A Tg of 111° C. was observed on second heat. The fluorine NMR spectrum showed peaks at −76.8 to −78.6 ppm (CF$_3$) and −95 to −125 ppm (CF$_2$) confirming incorporation of NB-OX and TFE, respectively, in a ratio of 1:2.8. A thin film of the polymer obtained by spin coating from a 2-heptahone solution showed an absorbance of 1.33 μm$^{-1}$ at 157 nm, indicating a high degree of optical transparency at this wavelength.

Analysis found: C, 52.03; H, 4.79; F, 37.22.

Example 5

The oxetane containing polymer was isomerized using the following procedure:

6 g of TFE/AdVether/OXVE terpolymer prepared in Example 3, were dissolved in 80 mL of ether and 0.1 g of 96% H$_2$SO$_4$ was added dropwise over a period of 5 min, to keep temperature of reaction mixture <25° C. and reaction mixture was agitated at ambient temperature for 1 h. Slightly yellow solution was filtered through glass wool. Based on NMR the solution at this point did not contain any material containing oxetane ring. $^1$H NMR spectrum of the material exhibit two dublets at 4.9 and 7.1 PPM, typical of vinyl protons of CH═CH fragment (1H NMR of starting material contained only one signal in this region ~6 PPM); $^{19}$F spectrum contained only one signal at −79.0 PPM (two signals −79.01 and −79.2 PPM in starting material). Solvent was removed under vacuum to leave 5.2 g of slightly yellow polymer, which was not soluble in ether, acetone and ethyl acetate. 4.5 g of this material was dissolved in 30 mL of dimethylacetamide at 60–70° C. (4 h) and the solution was left at ambient temperature for 2 days. Precipitate formed was separated from liquid, washed with H$_2$O, filtered, washed with methanol and air-dry for 1 hr. at 25° C. 4 g of white polymer were isolated. In IR spectrum of this material (KBr) were found two new bands at 1633 (C═C) and 3433 (OH), which were not present in IR spectrum of starting material.

Example 6

Preparation of Gamma, Gamma-dimethyl-alpha-methylene-gamma-butyrolactone (γ,γ-dimethyl MBL, or DM-MBL)

Example 6a

Preparation of Triisopropylbenzenesulfonyl Hydrazide

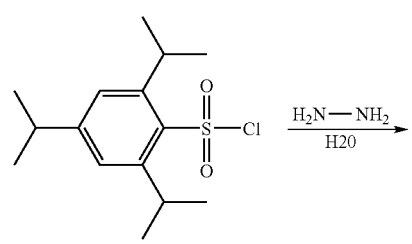

-continued

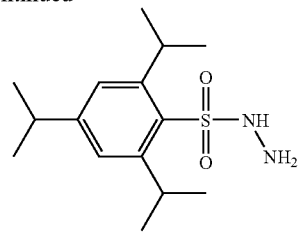

A 500 mL, three neck flask with a mechanical stirrer, thermometer, addition funnel, and a condenser with nitrogen tee was charged with 2,4,6-triisopropylbenzenesulfonyl chloride (100 g, 0.33 mol) and THF (120 mL) and cooled to 10° C. Hydrazine monohydrate (36 g, 0.73 mol) was added dropwise via addition funnel over 20 minutes (exothermic) while maintaining the temperature at 10–15° C. The reaction became a yellow slurry, then a cloudy solution, then a yellow slurry. At the end of the addition, a precipitate formed. Another 80 mL THF were added and the solids dissolved to give a yellow solution. The mixture was stirred for 30 min. Two layers were visible. The organic layer (top layer) was washed with 100 mL sat'd NaCl, dried over MgSO4, filtered, and concentrated on the rotary evaporator to obtain a light yellow solid. The solid was triturated with petroleum ether, filtered, and washed with 300 mL petroleum ether. The solid was dried overnight under a nitrogen stream to obtain the desired product (88 g theory 98.7 g) as a white solid. Another 4 g of the desired product were obtained by concentration of the filtrate and triturating with petroleum ether. $^1$H NMR (500 MHz, CDCl3) δ 1.2 (s, 18H), 3.0 (m, 1H), 3.5 (brs, 2H), 4.0 (m, 2H), 5.5 (brs, 1H), 7.3 (d, 2H); 13C NMR (125 MHz, CDCl3) δ 23.30, 24.68, 29.50, 34.02, 123.82, 128.50, 151.64, 153.63.

Example 6b

Preparation of Acetone 2,4,6-triisopropylbenzenesulfonyl Hydrazide

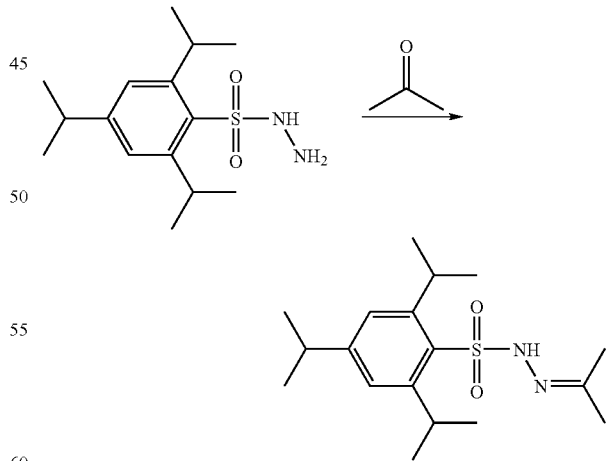

A 500 mL, 3 neck flask equipped with a mechanical stirrer, thermometer, addition funnel, and a condenser with nitrogen tee was charged with 300 mL acetone and add 2,4,6-triisopropylbenzenesulfonyl hydrazine (87.9 g, 0.29 mol) with stirring. Caution: the temperature rises from 20° C. to 30° C. upon addition of the solid. Concentrated HCl (1 mL) was added and the cloudy solution was stirred for 1 hour. The desired product (solid) precipitates over the course of the reaction. The mixture was filtered and the solids washed with water (2×200 mL), and dried with a nitrogen sweep to obtain 30.7 g of the desired product. The filtrate was slowly poured in to 300 mL water with cooling to give a white slurry. The slurry was stirred for 15 minutes, filtered, washed with 250 mL water, and dried under a nitrogen stream to obtain 64.2 g of the desired product as a white solid. Combined yield: 64.2 g+30.7 g=94.9 g (96%). 1H NMR (500 MHz, CDCl3) δ 1.75 (s, 18H), 1.9 (s, 3H), 1.95 (s, 3H), 2.5 (m, 1H), 4.1 (m, 2H), 7.2 (s, 2H); $^{13}$C NMR (125 MHz, CDCl3) δ 16.37, 23.46, 24.70, 24.84, 25.25, 29.83, 34.05, 123.68, 131.42, 151.29, 153.00, 154.06.

Example 6c

Preparation of γ,γ-dimethyl MBL (DM-MBL)

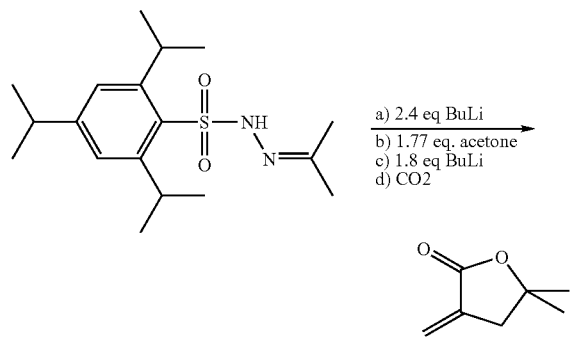

A 2000 mL, 3 neck flask equipped with a mechanical stirrer, thermometer, addition funnel, and a condenser with nitrogen tee was charged with 250 mL dimethoxyethane, acetone 2,4,6-triisopropyltosylhydrazone (45 g, 0.133 mol), and cooled to −78° C. in a dry ice/acetone bath. To this was added 2.4 equivalents of n-butyl lithium in hexanes (20.4 g, 0.32 mol, 128 mL) via addition funnel under nitrogen. The reaction changed from clear to orange to yellow/orange. The temperature was allowed to rise to −50° C. over 10 minutes. To this was added acetone (13.7 g, 0.236 mol, 1.77 equivalents) dropwise via syringe while maintaining −50° C. temperature (exothermic reaction with acetone). The reaction turns from orange/yellow to almost clear upon acetone addition. The reaction was cooled to −78° C., then another 1.8 equivalents n-butyl lithium (15.3 g, 0.24 mol, 96 mL) were added dropwise. The reaction turned from almost clear to yellow/orange to red/orange and was allowed to stir at −78° C. for 8 minutes then allowed to warm to −5° C. over 45 minutes. It was then held for one hou (at −5° C., and then cooled back to −78° C. (dry ice/acetone) and quenched by bubbling in $CO_2$ gas 10 min (slow, even bubbling, caution, exothermic reaction). The reaction was allowed to warm to room temperature and quenched with 400 mL cold water (CAUTION, add dropwise). To the mixture was added 200 mL EtOAc and the reaction was filtered through a bed of celite and celite washed with 200 mL EtOAc. The layers were separated and the aqueous layer acidified with trifluoroacetic acid (74 g) to pH=1 and stirred overnight. A small amount of solids precipitated over that time. The aqueous layer was extracted with EtOAc, (3×100 mL) and the combinedorganic layers were washed with 100 mL sat'd NaCl, dried over MgSO4, and concentrated in vacuo to give 90 g of a crude yellow oil This oil was purified by column chromatography: silica gel, 1/4 EtOAc/Hexanes ($R_f$ 0.4) to obtain 15.4 g (92%) of the desired product as a pale orange oil (87% pure by GC). The product was further purified by vacuum distillation to obtain the desired product as a colorless liquid; BP 50–53° C./0.4 mm Hg; $^1$H NMR (500 MHz, CDCl3) δ 1.35 (s, 6H), 2.7 (m, 2H), 5.55 (m, 1H), 6.15 (m, 1H); 13C NMR (125 MHz, CDCl3) δ 28.63, 41.43, 82.26, 122.62, 136.32, 170.46; (97.8% by GC).

Example 7

The methylmethacrylate(MMA)/methacrylic acid(MAA)/dimethyltuliplin (DMMBL) (42.1/16.85/41.08 w/w/w) copolymer was prepared by charging the following components to a 100 mL flask equipped with a thermocouple, stirrer, dropping funnel, reflux condenser and the means for bubbling nitrogen through the reaction.

| Parts by Weight | Grams |
|---|---|
| Portion 1 | |
| Methyl methacrylate (MMA) | 0.8 |
| Methacrylic acid (MAA) | 0.32 |
| Dimethyltulipalin (DMMBL) | 0.78 |
| Methylethyl ketone (MEK) | 10.00 |
| Portion 2 | |
| MEK | 2.0 |
| 2,2'-Azobis (2,4-Dimethyl Valeronitrile): Vazo ®-52 | 0.08 |
| Portion 3 | |
| MEK | 16.0 |
| 2,2'-Azobis (2,4-Dimethyl Valeronitrile): Vazo ®-52 | 0.96 |
| Portion 4 | |
| Methyl methacrylate (MMA) | 7.20 |
| Methacrylic acid (MAA) | 2.88 |
| Dimethyltulipalin (DMMBL) | 7.03 |
| Total | 48.05 |

The monomers in portion 1 were dissolved in 10 grams of MEK in the reaction flask. Nitrogen was sparged through the solution in the reaction flask while heating the solution by a mantle to reach the solution temperature to reflux. Portion 2, Vazo®-52 was dissolved in 2 grams of MEK in a container and added into the reaction flask. Then the Portion 3, Vazo®-52 initiator solution and Portion 4 monomer mixture were fed into the reaction flask at a uniform rate over 6 hours and 4 hours respectively at the reflux temperature. After the initiator feed was over, the polymerization was continued for another 1 hour at reflux temperature. Finally the polymer was precipitated by adding the polymer solution into a large excess (500 grams) of petroleum ether and filtered. The polymer was rinsed twice with a small amount of petroleum ether, filtered and dried in a vacuum oven overnight at 25–30° C. The polymer yield was 13.58 grams (71.5%).

Example 8

The following solution was prepared and magnetically stirred overnight.

| Component | Wt. (gm) |
|---|---|
| MMA/MAA/DM-MBL copolymer (weight feed ratio: 42.1/16.9/41.0) as described in Example 7 | 1.149 |
| Cyclohexanone | 7.803 |
| t-Butyl Lithocholate | 0.300 |

| Component | Wt. (gm) |
|---|---|
| 6.82% (wt) solution of triphenylsulfonium nonaflate dissolved in cyclohexanone which had been filtered through a 0.45μ PTFE syringe filter. | 0.748 |

Spin coating was done using a Brewer Science Inc. Model-100CB combination spin coater/hotplate on a 4 in. diameter Type "P", <100> orientation, silicon wafer. Development was performed by hand dipping in a dish.

The wafer was prepared by depositing 6 mL of hexamethyldisilazane (HMDS) primer and spinning at 5000 rpm for 10 seconds. Then about 3 mL of the above solution, after filtering through a 0.45 μm PTFE syringe filter, were deposited and spun at 3000 rpm for 60 seconds, and baked at 120° C. for 60 seconds.

248 nm imaging was accomplished by exposing the coated wafer to light obtained by passing broadband UV light from an ORIEL Model-82421 Solar Simulator (1000 watt) through a 248 nm interference filter which passes about 30% of the energy at 248 nm. Exposure time was 30 seconds, providing an unattenuated dose of 20.5 mJ/cm². By using a mask with 18 positions of varying neutral optical density, a wide variety of exposure doses were generated. After exposure the exposed wafer was baked at 120° C. for 120 seconds.

The wafer was developed in aqueous tetramethylammonium hydroxide (TMAH) solution (OHKA NMD-3, 1.19% TMAH solution) for 30 sec to give a positive image.

What is claimed is:

1. A photoresist composition comprising:
   (a) a protected material comprising a protecting group which is a cyclic ether group having the structure I or II:

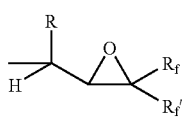

I

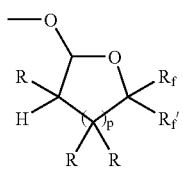

II wherein $R_f$ and $R_f'$ are the same or different fluoroalkyl groups of from one to about ten carbon atoms or taken together are $(CF_2)_a$ wherein a is an integer ranging from 2 to about 10, R independently represents a hydrogen atom or a straight chain or branched chain alkyl group of 1 to about 10 carbon atoms, and p is an integer of from 0 to about 8, wherein the protected material is substantially free of an acid group with a pKa of <11; and
   (b) a photoactive component.

2. The photoresist composition of claim 1 wherein the cyclic ether protecting group has the structure:

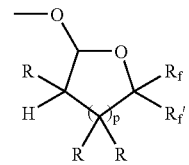

wherein $R_f$ and $R_f'$ are the same or different fluoroalkyl groups of from one to about ten carbon atoms or taken together are $(CF_2)_a$ wherein a is an integer ranging from 2 to about 10, R independently represents a hydrogen atom or a straight chain or branched chain alkyl group of 1 to about 10 carbon atoms, and p is an integer of from 0 to about 8.

3. The photoresist composition of claim 2 wherein $R_f$ and $R_f'$ are each perfluoroalkyl groups of 1 to 5 carbon atoms, p is zero and R is a hydrogen atom.

4. The photoresist composition of claim 3 wherein $R_f$ and $R_f'$ are each $CF_3$.

5. The photoresist composition of claim 1 wherein the protected material is a polymeric binder.

6. The photoresist composition of claim 5 wherein the polymeric binder has an absorption coefficient of less than about 4.0 μm⁻¹ at a wavelength of about 157 nm.

7. The photoresist composition of claim 1 wherein the protected material is a dissolution inhibitor.

8. The photoresist composition of claim 7 wherein the dissolution inhibitor comprises a paraffinic, cycloparaffinic or oligomeric compound containing at least one cyclic ether protecting group of structure I or II

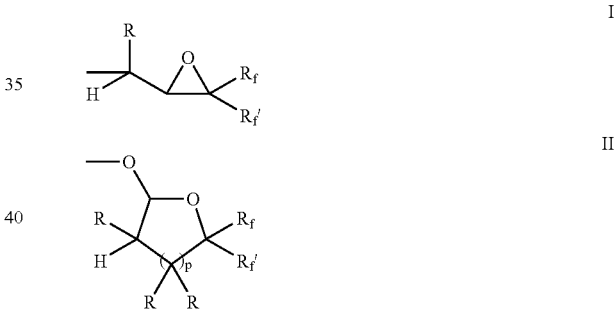

wherein $R_f$ and $R_f'$ independently represent fluoroalkyl groups of from one to about ten carbon atoms or taken together are $(CF2)_a$ wherein a is an integer ranging from 2 to about 10, R independently represents a hydrogen atom or a straight chain or branched chain alkyl group of 1 to about 10 carbon atoms, and p is an integer of from 0 to about 8, wherein the protected material is substantially free of an acid group with a pKa of <11.

9. The photoresist composition of claim 7 wherein the dissolution inhibitor comprises a paraffinic, cycloparaffinic or oligomeric compound containing at least one cyclic ester protecting group of the structure III

III wherein $R_1$ and $R_2$ independently represent an unsubstituted straight chain or branched chain alkyl group having 1 to 10 carbon atoms; aromatic, aralkyl, or alkaryl group having 6 to 14 carbon atoms; a substituted straight chain or branched chain alkyl group, aromatic group, aralkyl or alkaryl containing at least one heteroatom selected from the group consisting of O, S, N, P and halogen; and n is an integer ranging from 1 to about 4.

10. The photoresist composition of claim 7 wherein the dissolution inhibitor has an absorption of less than about 4.0 $\mu m^{-1}$ at a wavelength of about 157 nm.

11. The photoresist composition of claim 1 further comprising a solvent.

12. A coated substrate for semiconductor manufacture comprising a substrate having on a surface thereof a coating of the photoresist composition of any one of claims 1 to 10, and 11.

13. The coated substrate of claim 12 wherein the substrate comprises silicon, silicon oxide or silicon nitride.

14. The coated substrate of claim 12 wherein the substrate is primed.

15. The coated substrate of claim 13 wherein the substrate is primed with hexamethyldisilazane.

16. The coated substrate of claim 12 wherein the photoresist composition is coated onto the surface of the substrate by spin coating.

17. A process for preparing a photoresist image on a substrate comprising, in order:

1. forming a photoresist layer on a substrate, wherein the photoresist layer is prepared from a photoresist composition comprising:

(a) a protected material comprising a protecting group which is
     a cyclic ether group having structure I or II:

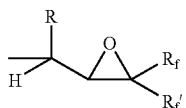

I

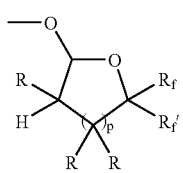

II wherein $R_f$ and $R_f'$ are the same or different fluoroalkyl groups of from one to about ten carbon atoms or taken together are $(CF_2)_a$ wherein a is an integer ranging from 2 to about 10, R independently represents a hydrogen atom or a straight chain or branched chain alkyl group of 1 to about 10 carbon atoms, and p is an integer of from 0 to about 8, wherein the protected material is substantially free of an acid group with a pKa of <11; and (b) a photoactive component;

2. imagewise exposing the photoresist layer to form imaged and non-imaged areas; and 3. developing the exposed photoresist layer having imaged and non-imaged areas to form a relief image on the substrate.

18. The process of claim 17 wherein the protecting group comprises a cyclic ether group having the structure:

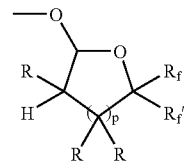

wherein $R_f$ and $R_f'$ are the same or different fluoroalkyl groups of from one to about ten carbon atoms or taken together are $(CF_2)_a$ wherein a is an integer ranging from 2 to about 10, R independently represents a hydrogen atom or a straight chain or branched chain alkyl group of 1 to about 10 carbon atoms, and p is an integer of from 0 to about 8.

19. The process of claim 17 wherein the protected material is a polymeric binder.

20. The process of claim 19 wherein the polymeric binder has an absorption of less than about 4.0 $\mu m^{-1}$ at a wavelength of about 157 nm.

21. The process of claim 17 wherein the protected material is a dissolution inhibitor.

22. The process of claim 21 wherein the dissolution inhibitor comprises a paraffinic, cycloparaffinic or oligomeric compound containing at least one cyclic ether functional groups having the structure:

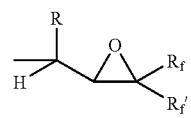

I

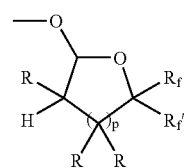

II wherein $R_f$ and $R_f'$ are the same or different fluoroalkyl groups of from one to about ten carbon atoms or taken together are $(CF_2)_a$ wherein a is an integer ranging from 2 to about 10, R independently represents a hydrogen atom or a straight chain or branched chain alkyl group of 1 to about 10 carbon atoms, and p is an integer of from 0 to about 8.

23. The process of claim 22 wherein the protected material is a dissolution inhibitor comprising a paraffinic, cycloparaffinic or oligomeric compound containing at least one cyclic ester functional groups having the structure:

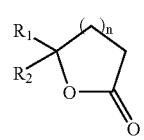

III wherein $R_1$ and $R_2$ independently represent an unsubstituted straight chain or branched chain alkyl group having 1 to 10 carbon atoms; aromatic, aralkyl, or alkaryl group having 6 to 14 carbon atoms; or substituted groups thereof containing at least one O, S, N, P or halogen; n is an integer ranging from 1 to about 4.

24. The process of claim 22 wherein the dissolution inhibitor has an absorption of less than about 4.0 $\mu m^{-1}$ at a wavelength of about 157 nm.

* * * * *

UNITED STATES PATENT AND TRADEMARK OFFICE
CERTIFICATE OF CORRECTION

PATENT NO. : 7,166,416 B2
APPLICATION NO. : 11/113695
DATED : January 23, 2007
INVENTOR(S) : Andrew Edward Feiring et al.

It is certified that error appears in the above-identified patent and that said Letters Patent is hereby corrected as shown below:

Column 22, line 46, "$(CF2)_a$" should read --$(CF_2)_a$--

Signed and Sealed this

First Day of May, 2007

JON W. DUDAS
*Director of the United States Patent and Trademark Office*